United States Patent
Arbel

(10) Patent No.: US 7,852,408 B2
(45) Date of Patent: Dec. 14, 2010

(54) FRACTIONAL PHASE-LOCKED LOOP FOR GENERATING HIGH-DEFINITION AND STANDARD-DEFINITION REFERENCE CLOCKS

(75) Inventor: Ygal Arbel, Morgan Hill, CA (US)

(73) Assignee: LSI Corporation, Milpitas, CA (US)

( * ) Notice: Subject to any disclaimer, the term of this patent is extended or adjusted under 35 U.S.C. 154(b) by 1247 days.

(21) Appl. No.: 11/383,551

(22) Filed: May 16, 2006

(65) Prior Publication Data

US 2007/0268405 A1 Nov. 22, 2007

(51) Int. Cl.
*H04N 5/06* (2006.01)
*H04N 5/46* (2006.01)
*H04N 9/45* (2006.01)
*H04N 9/455* (2006.01)
*H03L 7/85* (2006.01)
*H03L 7/89* (2006.01)
*H03L 7/06* (2006.01)
*H03L 7/26* (2006.01)
*H03B 1/00* (2006.01)

(52) U.S. Cl. ............ 348/521; 348/555; 348/558; 331/1 A; 331/16; 331/34; 331/74; 327/156

(58) Field of Classification Search ........... 331/1 A, 331/16, 34, 74; 327/156
See application file for complete search history.

(56) References Cited

U.S. PATENT DOCUMENTS

| 5,038,117 | A | * | 8/1991 | Miller | 331/16 |
|---|---|---|---|---|---|
| 5,337,024 | A | * | 8/1994 | Collins | 332/127 |
| 5,920,211 | A | * | 7/1999 | Anderson et al. | 327/116 |
| 6,108,046 | A | * | 8/2000 | Wu et al. | 348/558 |
| 6,236,278 | B1 | * | 5/2001 | Olgaard | 331/25 |
| 6,532,042 | B1 | * | 3/2003 | Kim | 348/537 |
| 6,795,519 | B2 | * | 9/2004 | Chakravarthy | 377/48 |
| 6,888,580 | B2 | * | 5/2005 | Dujmenovic | 348/731 |
| 6,914,464 | B2 | * | 7/2005 | Maeda | 327/156 |
| 7,327,172 | B2 | * | 2/2008 | Leung et al. | 327/147 |
| 7,359,007 | B2 | * | 4/2008 | Wu | 348/581 |
| 7,417,510 | B2 | * | 8/2008 | Huang | 331/74 |
| 7,443,250 | B2 | * | 10/2008 | Seethamraju et al. | 331/17 |
| 7,449,960 | B2 | * | 11/2008 | Bunch et al. | 331/1 A |
| 7,492,228 | B2 | * | 2/2009 | Strange | 331/16 |
| 7,493,510 | B2 | * | 2/2009 | Sung et al. | 713/503 |
| 2003/0020552 | A1 | * | 1/2003 | Troy et al. | 331/34 |
| 2003/0076137 | A1 | * | 4/2003 | Chakravarthy | 327/115 |
| 2003/0201805 | A1 | * | 10/2003 | Holland et al. | 327/113 |
| 2004/0165691 | A1 | * | 8/2004 | Rana | 377/48 |
| 2009/0261910 | A1 | * | 10/2009 | Locker | 331/34 |

* cited by examiner

*Primary Examiner*—Brian Yenke
(74) *Attorney, Agent, or Firm*—Christopher P. Maiorana, PC

(57) ABSTRACT

A programmable fractional phase-locked loop for generating a 148.50000 MHz high-definition television reference clock and a 148.35164 MHz high-definition reference clock from a 27 MHz crystal is disclosed. To generate the 148.50000 MHz reference clock, the fractional phase-locked loop is multiplied by $11/2$, and to generate the 148.35164 MHz reference clock, the fractional phase-locked loop is multiplied by $500/91$. Inside the fractional-phase locked loop however, the fraction $11/2$ is represented by a denominator that is an integral power of 2, and the fraction $500/91$ is represented by a denominator that is an integral multiple of 91.

8 Claims, 2 Drawing Sheets

FRACTIONAL PHASE-LOCKED LOOP FOR GENERATING HIGH-DEFINITION AND STANDARD-DEFINITION REFERENCE CLOCKS

FIELD OF THE INVENTION

The present invention relates to information technology in general, and, more particularly, to video decoding.

BACKGROUND OF THE INVENTION

The decoding and display of standard-definition video signals requires a reference clock with a frequency that is an integral multiple of 27 Mhz and the decoding and display of high-definition video signals requires a reference clock with a frequency of 148.35164 MHz, which is not an integral multiple of 27 MHz. Furthermore, some other high-definition video signals require a reference clock with a frequency of 148.5 MHz, which is also not an integral multiple of 27 MHz. The techniques for generating these three reference clocks simultaneously from the same reference crystal clock source in the prior art all have disadvantages, and, therefore, the need exists for a more elegant solution for doing so.

SUMMARY OF THE INVENTION

The present invention provides an apparatus for generating a 148.50000 MHz reference clock and a 148.35164 MHz reference clock from a 27 MHz signal without some of the costs and disadvantages for doing so in the prior art. In accordance with the illustrative embodiment, a crystal clock source provides a 27 MHz signal to a fractional phase-locked loop that multiplies the signal by a mixed fraction N.

To generate the 148.50000 MHz reference clock, the fraction is $11/2$, and to generate the 148.35164 MHz reference clock, the fraction is $500/91$. Inside the fractional-phase locked loop however, the fraction $11/2$ is represented by a fraction with a denominator that is an integral power of 2, and the fraction $500/91$ is represented by a fraction with a denominator that is an integral multiple of 91. In accordance with the present invention, a control signal changes the representative denominator between two similar values—the integral power of 2 and the integral multiple of 91—so that one fractional phase-locked loop design will suffice for both denominators.

The illustrative embodiment of the present invention comprises: a phase detector for generating a first signal based on the phase difference of a second signal and a third signal; a filter for filtering said first signal; a voltage-controlled oscillator for generating a fourth signal based on said first signal; and a fractional divider for generating said second signal based on said fourth signal, wherein said fractional divider divides said fourth signal by a fraction that has a denominator that is an integral multiple of 91.

DETAILED DESCRIPTION

Figure 1:
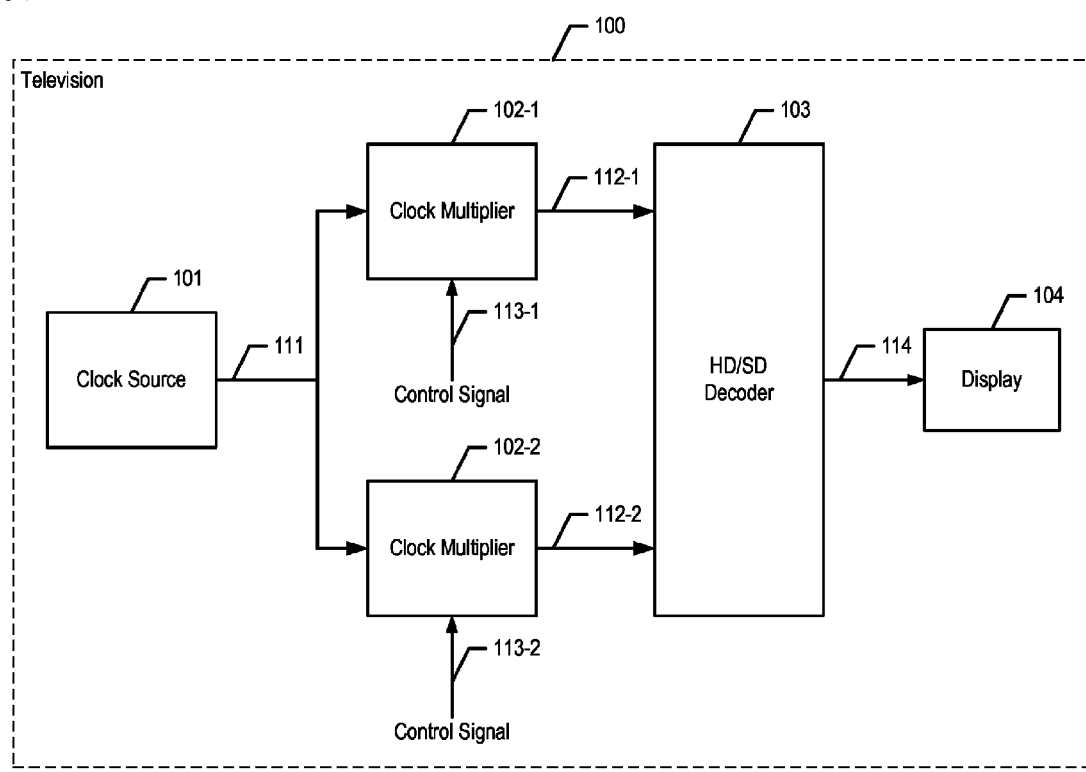
FIG. 1 depicts a block diagram of the salient components of television 100.

FIG. 1 depicts a block diagram of the salient components of television 100. Television 100 is capable of displaying both high-definition and standard-definition signals as described below. Television 100 comprises: clock source 101, clock multiplier 102-1, clock multiplier 102-2, HD/SD decoder 103, and display 104, interconnected as shown. It will be clear to those skilled in the art, after reading this specification, how to make and use alternative embodiments of the present invention in which both high-definition and standard-definition displays are present and simultaneously displaying the same image (although in different definitions).

In accordance with the illustrative embodiment, clock source 101 is a crystal oscillator that generates a 27 MHz clock signal on lead 111, in well-known fashion. It will be clear to those skilled in the art, after reading this specification, how to make and use alternative embodiments of the present invention in which clock source 101 has a different frequency. Furthermore, it will be clear to those skilled in the art, after reading this specification, how to make and use alternative embodiments of the present invention that use something other than a crystal for clock source 101.

In accordance with the illustrative embodiment, clock multiplier 102-1 receives:

i. the 27 MHz clock signal from clock source 101 on lead 111, and ii. a control signal, which is in a first state, on lead 113-1 and generates a 148.50000 MHz HD reference signal on lead 112-1, as described in detail and in the accompanying figures. It will be clear to those skilled in the art, after reading this specification, how to make and use alternative embodiments of the present invention in which the output of clock multiplier 102-1 has a different frequency.

In accordance with the illustrative embodiment, clock multiplier 102-2 receives:

i. the 27 MHz clock signal from clock source 101 on lead 111, and ii. a control signal, which is in a second state, on lead 113-2 and generates a 148.35164 MHz SD reference signal on lead 112-2, as described in detail and in the accompanying figures. It will be clear to those skilled in the art, after reading this specification, how to make and use alternative embodiments of the present invention in which the output of clock multiplier 102-2 has a different frequency. Although the illustrative embodiment comprises two clock multipliers, it will be clear to those skilled in the art, after reading this specification, how to make and use alternative embodiments of the present invention that comprise any number of clock multipliers.

In accordance with the illustrative embodiment, HD/SD decoder 103 receives the 148.50000 MHz HD reference signal on lead 112-1 and the 148.35164 MHz SD reference signal on lead 112-2 and uses them, in well-known fashion, to decode an HD or SD encoded signal, as appropriate, for display on display 104.

In accordance with the illustrative embodiment, display 104 is a liquid crystal display that displays the image provided by HD/SD decoder 103. It will be clear to those skilled in the art, after reading this specification, how to make and use alternative embodiments of the present invention in which display 104 uses another technology.

Figure 2:
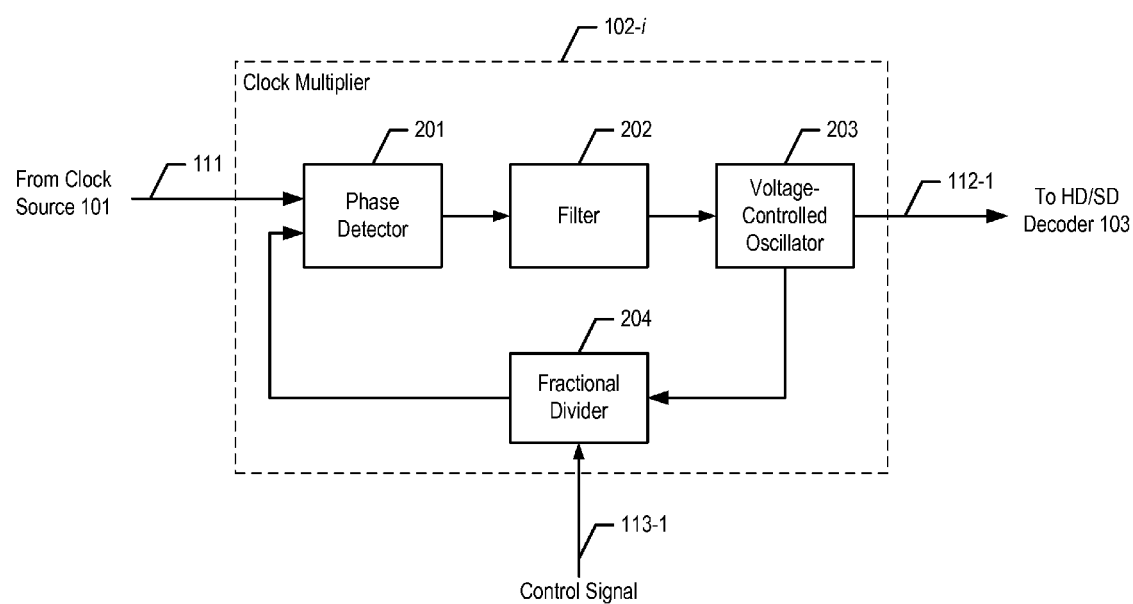
FIG. 2 depicts a block diagram of the salient components of clock multiplier 102-i, wherein i is a member of the set {1, 2}.

FIG. 2 depicts a block diagram of the salient components of clock multiplier 102-i, wherein i is a member of the set {1, 2}. Clock multiplier 102-i receives the 27 MHz clock signal from clock source 101 on lead 111 and outputs either (a) a 148.50000 MHz HD reference signal, or (b) a 148.35164 MHz SD reference signal on lead 112-i, depending on the state of the control signal on lead 113-i. When the control signal on lead 113-i is in the first state, the 148.35164 MHz SD reference signal is output on lead 112-i, and when the control signal on lead 113-i is in the second state, the 148.35164 MHz SD reference signal is output on lead 112-i.

Clock multiplier 102-i is a fractional phrase-locked loop whose output is N times the input frequency. When the control signal on lead 113-i is in the first state:

$$N = \frac{148,000,000}{27,000,000} = \frac{11}{2} \quad \text{(Eq. 1a)}$$

and when the control signal on lead 113-i is in the second state:

$$N = \frac{148,351,648}{27,000,000} = \frac{500}{91} \quad \text{(Eq. 1b)}$$

Clock multiplier 102-i comprises: phase detector 201, low-pass filter 202, voltage-controlled oscillator 203, and fractional divider 204, interconnected as shown.

In accordance with the illustrative embodiment, phase detector 201 outputs a signal to low-pass filter 202 that is based on the phase difference between the 27 MHz clock signal on lead 111 and the output of fractional divider 204. It will be clear to those skilled in the art how to make and use phase detector 201.

In accordance with the illustrative embodiment, low-pass filter 202 filters the output of phase detector 201 in well-known fashion. It will be clear to those skilled in the art how to make and use low-pass filter 202.

In accordance with the illustrative embodiment, voltage-controlled oscillator 203 creates a clock signal whose frequency is dependent on the output of low-pass filter 202 in well-known fashion. It will be clear to those skilled in the art how to make and use voltage-controlled oscillator 203.

In accordance with the illustrative embodiment, fractional divider 204 divides the output of voltage-controlled oscillator 203 by the value N and passes the decimated signal to phase detector 201. In accordance with the illustrative embodiment, the value N is represented in fractional divider 204 by a mixed fraction.

In general, when the control signal on lead 113-i is in the first state, the numerator is an integral multiple of 11 and the denominator is an integral power of 2, and when the control signal on lead 113-i is in the second state, the numerator is an integral multiple of 500 and the denominator is an integral multiple of 91. In particular, when the control signal on lead 113-i is in the first state, the numerator is 360,448 and the denominator is 65,536, and when the control signal on lead 113-i is in the second state, the numerator is 360,000 and the denominator is 65,520. Because the difference in the denominators in both states is small and the difference in the numerators in both states is small, the task of designing one circuit to effectively operate with both pairs of numerators and denominators is greatly simplified.

It will be clear to those skilled in the art, after reading this specification, how to make and use alternative embodiments of the present invention that have other combinations of numerators and denominators, such as those presented in Table 1. Note that in each case, the fraction in the first state equals $11/2$ exactly and the fraction in the second state equals $500/91$ exactly.

TABLE 1

Example Numerator and Denominator Pairs

| Control Signal in First State | | Control Signal in Second State | |
|---|---|---|---|
| Numerator | Denominator | Numerator | Denominator |
| 704 | 128 | 500 | 91 |
| 1,408 | 256 | 1,000 | 182 |
| 2,816 | 512 | 2,500 | 455 |
| 5,632 | 1,024 | 5500 | 1,001 |
| 11,264 | 2,048 | 11,000 | 2,002 |
| 22,528 | 4,096 | 22,500 | 4,095 |
| 45,056 | 8,192 | 45,000 | 8,190 |
| 90,112 | 16,384 | 90,000 | 16,380 |
| 180,224 | 32,768 | 180,000 | 32,760 |
| 360,448 | 65,536 | 360,000 | 65,520 |
| 720,896 | 131,072 | 720,000 | 131,040 |
| 1,441,792 | 262,144 | 1,440,000 | 262,080 |
| 2,883,584 | 524,288 | 2,880,500 | 524,251 |
| 5,767,168 | 1,048,576 | 5,761,000 | 1,048,502 |
| 11,534,336 | 2,097,152 | 11,522,500 | 2,097,095 |
| 23,068,672 | 4,194,304 | 23,045,500 | 4,194,281 |
| 46,137,344 | 8,388,608 | 46,091,000 | 8,388,562 |
| 92,274,688 | 16,777,216 | 92,182,500 | 16,777,215 |

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other methods, materials, components, etc.

What is claimed is:

1. An apparatus comprising:
   a phase detector configured to generate a first signal based on a phase difference between a second signal and a third signal;
   a filter configured to filter said first signal;
   a voltage-controlled oscillator configured to generate a fourth signal based on said first signal; and
   a fractional divider configured to generate said second signal in response to (i) said fourth signal and (ii) a control signal, wherein (A) said fractional divider (i) generates said first signal oscillating at a frequency usable by a standard definition decoder by dividing said fourth signal by a first fraction that has (a) a denominator that is a first integer and (b) a numerator that is a second integer and (ii) generates said first signal oscillating at a frequency usable by a high definition decoder by dividing said fourth signal by a second fraction that has (a) a denominator that is a third integer and (b) a numerator that is a fourth integer and (B) said control signal switches said fractional divider between generating said first signal to oscillate at said frequency usable by said standard definition decoder and said frequency usable by said high definition decoder.

2. The apparatus of claim 1, wherein said denominator of said first fraction is 65,520.

3. The apparatus of claim 1, wherein said first fraction has a numerator that is an integral multiple of 500.

4. The apparatus of claim 1, wherein said numerator of said second fraction is 360,000.

5. The apparatus of claim 1, wherein said denominator of said second fraction is 65,520.

6. The apparatus according to claim 1, wherein:
    said second signal comprises a reference clock signal oscillating at a fixed frequency; and
    said third signal comprises a feedback of said first signal.

7. The apparatus according to claim 6, wherein said apparatus generates said frequency usable by said standard definition decoder and said frequency usable by said high definition decoder using only one fractional divider without changing said frequency of said reference clock signal.

8. The apparatus according to claim 7, wherein said apparatus generates said frequency usable by said standard definition decoder and said frequency usable by said high definition decoder using the same reference clock signal.

* * * * *